United States Patent [19]

Simmons et al.

[11] Patent Number: 4,868,839
[45] Date of Patent: Sep. 19, 1989

[54] SEMICONDUCTOR LASER ARRAY WITH NONPLANAR DIFFRACTION REGION

[75] Inventors: William W. Simmons, Rancho Palos Verdes; Michael Jansen, Los Angeles; Jaroslava Z. Wilcox, Los Angeles; Jane J. Yang, Los Angeles, all of Calif.

[73] Assignee: TRW Inc., Redondo Beach, Calif.

[21] Appl. No.: 168,066

[22] Filed: Mar. 14, 1988

[51] Int. Cl.$^4$ .............................. H01S 3/19; H01S 3/08
[52] U.S. Cl. ........................................ 372/50; 372/20; 372/92; 372/99; 372/107; 372/108
[58] Field of Search ...................... 372/50, 99, 49, 95, 372/92, 97, 98, 93, 94, 108, 102, 20, 107

[56] References Cited

U.S. PATENT DOCUMENTS

| | | | |
|---|---|---|---|
| 3,979,695 | 9/1976 | Erickson | 368/20 |
| 4,251,780 | 2/1981 | Scifres et al. | 372/46 |
| 4,491,950 | 1/1985 | Hoffmann | 372/99 |
| 4,739,508 | 4/1988 | Clark | 372/99 |
| 4,764,935 | 8/1988 | Wilcox et al. | 372/50 |

FOREIGN PATENT DOCUMENTS 0016191  5/1971  Japan ..................... 372/99

OTHER PUBLICATIONS

Shyh Wang et al., "In-Phase Locking in Diffraction-Coupled Phased-Array Diode Lasers", Appl. Phys. Lett., 48(26), pp. 1770-1772, Jun. 30, 1986.

Primary Examiner—William L. Sikes
Assistant Examiner—Georgia Y. Epps
Attorney, Agent, or Firm—Noel F. Heal; Sol L. Goldstein

[57] ABSTRACT

An array of semiconductor lasers formed in a single substrate and having parallel waveguides that terminate in a wide diffraction region fabricated with the array structure. The diffraction region has a curved reflective surface selected to achieve a desired degree of coupling among the elements of the array, and to enhance and stabilize a preferred lateral mode of oscillation.

7 Claims, 1 Drawing Sheet

SEMICONDUCTOR LASER ARRAY WITH NONPLANAR DIFFRACTION REGION

BACKGROUND OF THE INVENTION

This invention relates generally to semiconductor lasers and, more particularly, to semiconductor laser arrays. By way of background, a semiconductor laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes combine in the region of the active layer, and light is emitted. The layers on each side of the active layer have a lower index of refraction than the active layer, and function as cladding layers to confine the light in the plane of the active layer. Various techniques are used to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in the plane of the active layer.

The output power of a single laser diode is far too low for many applications, and much work has been done in the area of semiconductor laser arrays. Because of the manner in which adjacent elements of a laser array couple and interact, the resultant output beam does not always have the most desirable properties. In particular, the nature of the far-field radiation pattern from a laser array is a property of the array that has proved somewhat difficult to control with precision. A single-lobed far-field pattern is usually desired, but, because the mode of oscillation needed to produce a desirable far-field pattern is not a naturally occurring one, a singlelobed pattern is not obtained from an array unless some special design approach is followed.

In general, an array of laser emitters can oscillate in one or more of multiple possible configurations, known as array modes. In the most desirable array mode, all of the emitters oscillate in phase. This is known as the 0°-phase-shift array mode, and it produces a far-field pattern in which most of the energy is concentrated in a single lobe whose width is limited, ideally, only by the diffraction of light. The least desirable array mode is obtained when adjacent laser emitters are 180° out of phase. This is the 180°-phase-shift array mode, and it produces two relatively widely spaced lobes in the far-field distribution pattern. Multiple additional modes exist between these two extremes, depending on the phase alignment of the separate emitters. Most laser arrays operate in two or three array modes simultaneously and produce one or more beams that are typically two or three times wider than the diffraction limit.

It may also be desired to adjust the output radiation pattern from an array to meet some other criterion. For example, the laser array application may call for some of the elements of the array to produce more intense radiation than others, perhaps with more light emanating from the center of the array. The present state of the art of laser arrays does not permit such control of the elemental outputs, except by individual electrical control.

It will be appreciated from the foregoing that there is still a significant need in the design of semiconductor laser arrays, for an optical structure that provides a broad degree of control of the output from a semiconductor laser array, including the ability to control the supermodes of oscillation, and to provide that selected elements emit more radiation than others. The present invention satisfies this need.

SUMMARY OF THE INVENTION

The present invention resides in a semiconductor laser array having a plurality of laser elements, an integral diffraction coupling region at one end of the array, and a curved end mirror in the diffraction region, to achieve a desired degree of coupling among the laser elements, and to enhance and stabilize a selected lateral mode of oscillation.

Briefly, and in general terms, the structure of the invention includes a plurality of semiconductor laser diodes arrayed laterally in a single structure and having parallel waveguides, means for guiding light laterally in the parallel waveguides, means for connecting the laser diodes to a power supply, a wide diffraction region formed adjacent to the waveguides, such that the parallel waveguides are coupled into the diffraction region, and a pair of at least partially reflective surfaces formed at opposite ends of the structure, including a planar surface at the end opposite the diffraction region, and a curved surface at the end of the diffraction region. The curved surface is selected to achieve a desired degree of coupling among the waveguide elements, and to enhance and stabilize a preferred lateral mode of oscillation.

It will be appreciated that the present invention represents a significant advance in the field of semiconductor laser arrays. In particular, it provides a technique for controlling the selection lateral supermodes of oscillation of the array, and for controlling, through phase interference effects, the weighting of array elements and the resultant beam properties. Other aspects and advantages of the invention will become apparent from the following more detailed description, taken in conjunction with the accompanying drawings.

DESCRIPTION OF THE PREFERRED EMBODIMENTS

Figure 1:
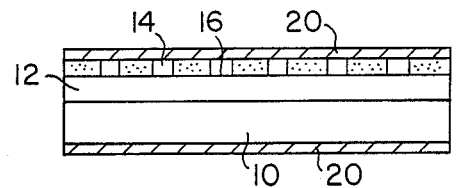
FIG. 1 is a simplified cross-sectional view of a semiconductor laser array.
Figure 2:
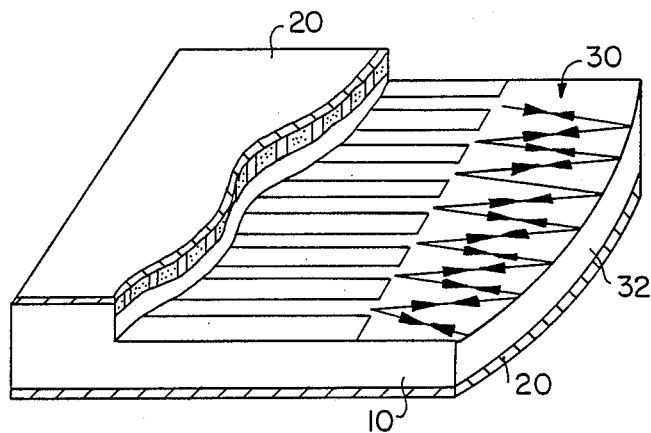
FIG. 2 is a simplified perspective view of a semiconductor laser array in accordance with the invention, with portions broken away for clarity.
Figure 3A:
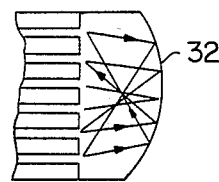
FIGS. 3a–3d are simplified plan views of a fragmentary portion of four embodiments of the array, showing different curvatures of the end mirror.
Figure 3B:
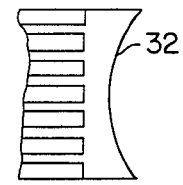
Figure 3C:
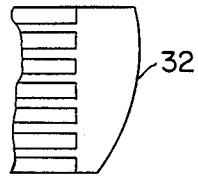
Figure 3D:
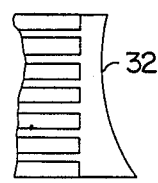

As shown in the drawings for purposes of illustration, the present invention is concerned with semiconductor laser arrays. A simplified cross section of an array is shown in FIG. 1. It includes a substrate of gallium arsenide, indicated by reference numeral 10, two cladding layers 12 and 14 of gallium aluminum arsenide, one of which is doped with n type material and the other doped with p type material, and an active layer 16 of undoped gallium arsenide sandwiched between the cladding layers. There may also be contact layers of heavily doped material. Metallization layers 20 are used to make electrical contact with the structure. Depending on the array design, the individual laser elements may be separated electrically by using separate contact stripes, to provide a gain-guided array. Or the separate elements may be defined by interposed materials of different refractive index, referred to as index guiding. Whether the array is gain-guided or index-guided is of little or no consequence from the standpoint of the present invention.

The laser elements terminate in a diffraction region 30 that provides no lateral guiding of light emitted from the elements, except possibly at the lateral edges of the region. Such regions have been used to provide diffraction coupling between the laser elements, as an adjunct or an alternative to the evanescent coupling that exists between closely spaced waveguides in an array.

Instead of the planar reflective surface that is usually provided in diffraction regions, the region 30 has a curved end surface 32 designed to enhance a particular lateral mode of oscillation of the array. For example, the array may be designed to favor the 0°-phase-shift array mode and produce single-lobed far-field pattern. Light is emitted from a narrow waveguide of one of the array elements in a relatively narrow beam. If the reflective end surface of the diffraction region were flat, radiation from one elemental waveguide would, at best, be coupled only to the next adjacent waveguide. With a curved end surface, the possibilities are greatly expanded. Light from one waveguide can be coupled back into an element displaced several waveguide spacings to one side, and with appropriate selection of the distances involved light can be coupled back into the displaced waveguide with any desired relative phase. FIGS. 3a–3d show in general the possible arrangements of curved surfaces in the so-called unstable resonator arrangements of FIGS. 3b–3d.

Various configurations of the invention may be employed to introduce weighting functions into the coupling between array elements. The use of a nonplanar mirror has the advantage that phase interference effects within the diffraction region can be adjusted to achieve maximum mode discrimination, and supermode stabilization in the array. Moreover, the diffraction region can be shortened if the end surface is curved, and the coupling functions still achieved. A shorter diffraction region will minimize phase differences between adjacent array elements.

It will be appreciated from the foregoing that the present invention provides a significant advance in the field of semiconductor laser arrays. The use of a diffraction region with a curved reflective end surface provides the array designer with a large number of alternatives to choose from when adapting an array to a particular application. Higher order supermodes may be suppressed and single supermode operation maintained. Moreover, the phase effects taking place in the diffraction region can be tailored to different array geometries and operating conditions by appropriate selection of the reflective surface geometry. Sidelobe suppression can be easily implemented through amplitude weighting the output beam by appropriate reflections across the array aperture.

It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A semiconductor laser array, comprising:
   a plurality of semiconductor laser diodes arrayed laterally in a single structure and having parallel waveguides;
   means for guiding light laterally in the parallel waveguides;
   means for connecting the laser diodes to a power supply;
   a wide diffraction region formed adjacent to and in the same structure as the waveguides, such that the means for guiding light laterally in the waveguides terminates at the wide diffraction region, and light from the parallel waveguides is coupled into the diffraction region; and
   a pair of at least partially reflective surfaces formed at opposite ends of the structure, including a planar surface at the end opposite the diffraction region, and a curved surface at the end of the diffraction region, the curved surface being selected to achieve a desired degree of coupling among the waveguide elements, and to enhance and stabilize a preferred lateral mode of oscillation.

2. A semiconductor laser array as defined in claim 1, wherein:
   the curved surface is convex toward the diffraction region.

3. A semiconductor laser array as defined in claim 2, wherein:
   the curved surface has an axis of curvature that is parallel with the array waveguides and is aligned with the center of the array.

4. A semiconductor laser array as defined in claim 2, wherein:
   the curved surface has an axis of curvature that is not parallel with the array waveguides.

5. A semiconductor laser array as defined in claim 1, wherein:
   the curved surface is concave toward the diffraction region.

6. A semiconductor laser array as defined in claim 5, wherein:
   the curved surface has an axis of curvature that is parallel with the array waveguides and is aligned with the center of the array.

7. A semiconductor laser array as defined in claim 5, wherein:
   the curved surface has an axis of curvature that is not parallel with the array waveguides.

* * * * *